(12) United States Patent
Lee et al.

(10) Patent No.: US 9,171,755 B2
(45) Date of Patent: Oct. 27, 2015

(54) METHODS OF MANUFACTURING SEMICONDUCTOR DEVICES INCLUDING CAPPED METAL PATTERNS WITH AIR GAPS IN-BETWEEN FOR PARASITIC CAPACITANCE REDUCTION

(71) Applicant: Samsung Electronics Co., Ltd., Suwon-Si, Gyeonggi-Do (KR)

(72) Inventors: Euibok Lee, Seoul (KR); Jongmin Baek, Suwon-si (KR); Dohyoung Kim, Hwaseong-si (KR); Tsukasa Matsuda, Seongnam-si (KR); Youngwoo Cho, Suwon-si (KR); Jongseo Hong, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/453,310

(22) Filed: Aug. 6, 2014

(65) Prior Publication Data

US 2015/0115398 A1 Apr. 30, 2015

(30) Foreign Application Priority Data

Oct. 29, 2013 (KR) ........................ 10-2013-0129376

(51) Int. Cl.
| | | |
|---|---|---|
| *H01L 21/768* | (2006.01) | |
| *H01L 21/02* | (2006.01) | |
| *H01L 21/764* | (2006.01) | |
| *H01L 21/762* | (2006.01) | |

(52) U.S. Cl.
CPC ...... *H01L 21/7682* (2013.01); *H01L 21/02296* (2013.01); *H01L 21/762* (2013.01); *H01L 21/764* (2013.01); *H01L 21/76802* (2013.01); *H01L 21/76883* (2013.01)

(58) Field of Classification Search
USPC ........................... 257/522, 751; 438/412, 652
See application file for complete search history.

(56) References Cited

U.S. PATENT DOCUMENTS

| | | | |
|---|---|---|---|
| 6,214,728 B1 | 4/2001 | Chan et al. | |
| 6,251,786 B1 | 6/2001 | Zhou et al. | |
| 6,265,321 B1 * | 7/2001 | Chooi et al. | ................ 438/725 |
| 6,566,250 B1 | 5/2003 | Tu et al. | |
| 7,057,287 B2 | 6/2006 | Kumar et al. | |
| 7,060,619 B2 | 6/2006 | Cowley et al. | |
| 7,422,983 B2 | 9/2008 | Cotte et al. | |

(Continued)

FOREIGN PATENT DOCUMENTS

| | | |
|---|---|---|
| JP | 2008244034 A | 10/2008 |
| JP | 2009141199 A | 6/2009 |

(Continued)

*Primary Examiner* — Marc Armand
*Assistant Examiner* — Younes Boulghassoul
(74) *Attorney, Agent, or Firm* — Harness, Dickey & Pierce, PLC (57) ABSTRACT

A method of manufacturing a semiconductor device may include: forming an interlayer insulating layer having openings on a substrate; forming a metal layer in the openings and on the interlayer insulating layer, the metal layer including a sidewall portion on a sidewall of each of the openings and a bottom portion on a bottom surface of each of the openings, wherein the bottom portion is thicker than the sidewall portion; reflowing the metal layer to form metal patterns in the openings, the metal patterns having top surfaces at a level lower than a topmost surface of the interlayer insulating layer; and/or forming capping patterns covering the metal patterns in the openings.

20 Claims, 5 Drawing Sheets

(56) References Cited

U.S. PATENT DOCUMENTS

| | | |
|---|---|---|
| 8,026,176 B2 * | 9/2011 | Sakuma et al. ............... 438/695 |
| 8,497,202 B1 * | 7/2013 | Edelstein et al. ............. 438/618 |
| 2004/0175921 A1 | 9/2004 | Cowley et al. |
| 2005/0040532 A1 | 2/2005 | Kumar et al. |
| 2006/0189134 A1 | 8/2006 | Cotte et al. |
| 2007/0249156 A1 | 10/2007 | Bonilla et al. |
| 2009/0169760 A1 * | 7/2009 | Akolkar et al. ............... 427/455 |
| 2011/0101492 A1 * | 5/2011 | Won et al. ..................... 257/522 |
| 2013/0115767 A1 * | 5/2013 | Yang et al. .................... 438/652 |
| 2014/0138790 A1 * | 5/2014 | Sugino et al. ................. 257/522 |
| 2014/0183739 A1 * | 7/2014 | Li et al. ......................... 257/751 |
| 2014/0287577 A1 * | 9/2014 | Emesh et al. ................. 438/618 |

FOREIGN PATENT DOCUMENTS

| | | |
|---|---|---|
| JP | 2011086837 A | 4/2011 |
| KR | 20040050118 A | 6/2004 |
| KR | 20070052452 A | 5/2007 |

\* cited by examiner

METHODS OF MANUFACTURING SEMICONDUCTOR DEVICES INCLUDING CAPPED METAL PATTERNS WITH AIR GAPS IN-BETWEEN FOR PARASITIC CAPACITANCE REDUCTION

CROSS-REFERENCE TO RELATED APPLICATION(S)

This application claims priority under 35 U.S.C. §119 from Korean Patent Application No. 10-2013-0129376, filed on Oct. 29, 2013, in the Korean Intellectual Property Office (KIPO), the entire contents of which are incorporated herein by reference.

BACKGROUND

1. Field

Some example embodiments of the inventive concepts may relate to semiconductor devices. Some example embodiments of the inventive concepts may relate to semiconductor devices including air gaps between metal patterns. Some example embodiments of the inventive concepts may relate to methods of manufacturing the same.

2. Description of Related Art

As semiconductor devices have been fine and highly integrated, pitches of metal interconnections of semiconductor devices may have been narrowed. Thus, parasitic capacitance of semiconductor devices may have been increased such that operating speeds of semiconductor devices may be reduced. Various research may have been conducted for low-resistance copper interconnections and/or low-dielectric constant (low-k) dielectrics in order to reduce the parasitic capacitance of semiconductor devices.

SUMMARY

Some example embodiments of the inventive concepts may provide semiconductor devices capable of reducing parasitic capacitance and/or of improving electrical characteristics. Some example embodiments may provide methods of manufacturing the same.

Some example embodiments of the inventive concepts may also provide semiconductor devices having excellent reliability. Some example embodiments may provide methods of manufacturing the same.

In some example embodiments, a method of manufacturing a semiconductor device may comprise: forming an interlayer insulating layer having openings on a substrate; forming a metal layer in the openings and on the interlayer insulating layer, the metal layer including a sidewall portion on a sidewall of each of the openings and a bottom portion on a bottom surface of each of the openings, wherein the bottom portion is thicker than the sidewall portion; reflowing the metal layer to form metal patterns in the openings, the metal patterns having top surfaces at a level lower than a topmost surface of the interlayer insulating layer; and/or forming capping patterns covering the metal patterns in the openings.

In some example embodiments, the method may further comprise: forming an air gap in the interlayer insulating layer between the openings.

In some example embodiments, the air gap may be formed after the forming of the capping patterns.

In some example embodiments, the metal patterns may include copper.

In some example embodiments, the metal layer may include an upper metal layer and a lower metal layer. The upper metal layer may be provided on the top surface of the interlayer insulating layer. The lower metal layer may be provided in each of the openings. The reflowing of the metal layer may include migrating the upper metal layer into the openings to form the metal patterns. The metal patterns may be separated from the upper metal layer remaining on the top surface of the interlayer insulating layer while the metal layer is reflowed.

In some example embodiments, the method may further comprise: forming a barrier layer on the bottom surfaces and the sidewalls of the openings before the forming of the metal layer.

In some example embodiments, the forming of the capping patterns may comprise: forming a capping layer covering the metal patterns and the interlayer insulating layer; and/or planarizing the capping layer and the interlayer insulating layer. A portion of the metal layer may remain on the interlayer insulating layer after the metal layer is reflowed. The planarizing of the capping layer and the interlayer insulating layer may include removing the remaining portion of the metal layer.

In some example embodiments, the capping layer may be planarized by a chemical mechanical polishing (CMP) process. The metal patterns may not be exposed during the CMP process.

In some example embodiments, the forming of the metal layer and the reflowing of the metal layer may be performed in-situ.

In some example embodiments, the capping patterns may include one or more of cobalt, ruthenium, tantalum, tantalum nitride, titanium, and titanium nitride.

In some example embodiments, a semiconductor device may comprise: a substrate; an interlayer insulating layer having openings on the substrate; metal patterns in lower regions of the openings; capping patterns in the openings and covering the metal patterns; and/or a barrier layer covering a sidewall and a bottom surface of each of the metal patterns. The interlayer insulating layer may have an air gap provided between the metal patterns.

In some example embodiments, top surfaces of the metal patterns may be flat.

In some example embodiments, the capping patterns may include one or more of cobalt, ruthenium, tantalum, tantalum nitride, titanium, and titanium nitride.

In some example embodiments, the forming of the air gap may comprise: forming a sacrificial layer on the interlayer insulating layer between the openings; forming an upper capping layer on the sacrificial layer; and/or removing the sacrificial layer through the upper capping layer.

In some example embodiments, a method of manufacturing a semiconductor device may comprise: forming an insulating layer, including openings, on a substrate; forming a metal layer in the openings and on the insulating layer, the metal layer including portions on sidewalls and bottoms of the openings; reflowing the metal layer to form metal patterns in the openings; and/or forming capping patterns covering the metal patterns in the openings.

In some example embodiments, the portions on the sidewalls of the openings may be thinner than the portions on the bottoms of the openings.

In some example embodiments, the method may further comprise: forming an air gap in the insulating layer between the openings.

In some example embodiments, the forming of the air gap may comprise: forming a sacrificial layer on the insulating layer between the openings; forming an upper capping layer on the sacrificial layer; and/or removing the sacrificial layer through the upper capping layer.

In some example embodiments, the method may further comprise: forming an air gap above the insulating layer between the openings.

In some example embodiments, the forming of the air gap may comprise: forming a sacrificial layer on the insulating layer between the openings; forming an upper capping layer on the sacrificial layer; and/or removing the sacrificial layer through the upper capping layer.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION OF THE EMBODIMENTS

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1:
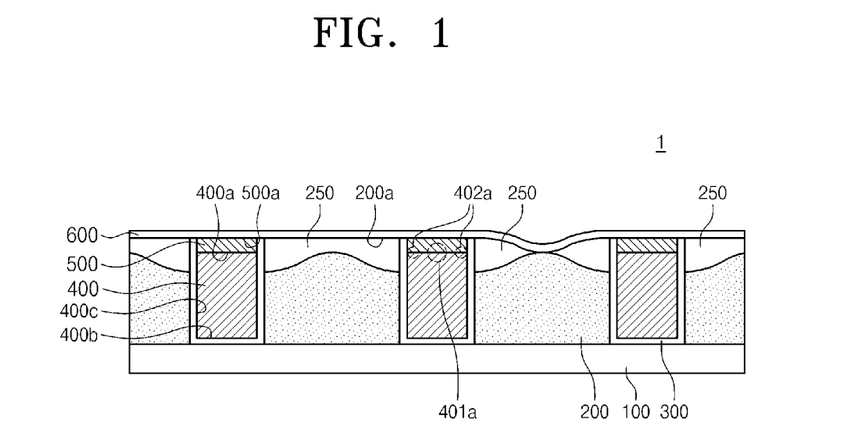
FIG. 1 is a cross-sectional view illustrating a semiconductor device according to some example embodiments of the inventive concepts.

FIG. 1 is a cross-sectional view illustrating a semiconductor device according to some example embodiments of the inventive concepts.

Referring to FIG. 1, a semiconductor device 1 may include an interlayer insulating layer 200, an air gap 250, barrier layers 300, metal patterns 400, and capping patterns 500 on a substrate 100.

The substrate 100 may include plugs (not shown) that are connected to semiconductor elements (not shown) and/or metal regions (not shown). The plugs (not shown) may include a non-insulating material, for example, a metallic material, a metal, or a doped semiconductor material.

The interlayer insulating layer 200 may be provided on the substrate 100. The interlayer insulating layer 200 may have openings 210 exposing the plugs (not shown). The openings 210 may penetrate the interlayer insulating layer 200. The openings 210 may be spaced apart from each other. The interlayer insulating layer 200 may include a non-conductive material (e.g., an insulating material). For example, the interlayer insulating layer 200 may include at least one of silicon nitride, silicon carbide, silicon carbonitride, and silicon oxynitride.

The barrier layers 300 may be disposed in the openings 210, respectively. The barrier layers 300 may be disposed between the interlayer insulating layer 200 and the metal patterns 400. The barrier layers 300 may further extend between the interlayer insulating layer 200 and the capping patterns 500. The barrier layers 300 may prevent a material included in the metal patterns 400 from being diffused into the interlayer insulating layer 200. The barrier layers 300 may include at least one of titanium, tantalum, titanium nitride, and tantalum nitride.

The metal patterns 400 may be disposed in lower regions of the openings 210, respectively. The metal patterns 400 may include, for example, copper (Cu). Each of the metal patterns 400 may have a top surface 400a facing the capping pattern 500, a bottom surface 400b opposite to the top surface 400a, and a sidewall 400c. The metal patterns 400 may be separated from each other and may be electrically isolated from each other. The top surfaces 400a of the metal patterns 400 may not be exposed during an etching process. Thus, the top surfaces 400a of the metal patterns 400 may be flat. In some embodiments, the top surface 400a of the metal pattern 400 may have an edge portion 402a and a center portion 401a. The edge portion 402a may be disposed at a substantially same level as the center portion 401a. The top surface 400a of the metal pattern 400 may have a surface roughness value less than that of an etched surface of a metal. In some embodiments, the top surface 400a of the metal pattern 400 may have a surface roughness value less than that of a top surface 500a of the capping pattern 500. The metal patterns 400 may be metal lines. For example, the metal patterns 400 may extend in parallel to each other along one direction, and the one direction may be parallel to a top surface of the substrate 100. The metal patterns 400 may not have a void therein. Thus, the metal patterns 400 of the semiconductor device 1 may have a lower resistance value than a metal pattern including a void. As a result, electrical characteristics of the semiconductor device 1 may be improved such that reliability of the semiconductor device 1 may be improved. For example, a leakage current density of a bad metal pattern having the void may be in a range of about $10^{-1}$ A/cm$^2$ to about $10^{-6}$ A/cm$^2$. On the contrary, a leakage current density of the metal pattern 400 according to the inventive concepts may be in a range of about $10^{-9}$ A/cm$^2$ to about $10^{-12}$ A/cm$^2$.

The capping patterns 500 may be disposed in upper regions of the openings 210, respectively. The capping patterns 500 may cover the metal patterns 400, respectively. Thus, the metal patterns 400 may not be exposed outside by the capping patterns 500. The capping patterns 500 may prevent the metal patterns 400 from being damaged. The top surfaces 500a of the capping patterns 500 may be disposed at a substantially same as the topmost surface 200a of the interlayer insulating layer 200. Thus, the capping patterns 500 may be separated from each other and may be electrically isolated from each other. As a result, occurrence of a leakage current between the metal patterns 400 may be prevented. The capping patterns 500 may include a metallic material such as a metal. For example, the capping patterns 500 may include at least one of cobalt, ruthenium, tantalum, tantalum nitride, titanium, and titanium nitride.

The air gap 250 may be provided on the interlayer insulating layer 200 and may be disposed between the metal patterns 400. The air gap 250 may include air. The air has a dielectric constant (e.g., about 1.0006) lower than that of the interlayer insulating layer 200. As a result, parasitic capacitance between the metal patterns 400 may be reduced by the air gap 250 disposed between the metal patterns 400.

An upper capping layer 600 may be disposed on the capping patterns 500 and the interlayer insulating layer 200. The upper capping layer 600 may be formed of at least one of silicon dioxide (SiO$_2$), silicon nitride (SiN), SiOCH, silicon carbonitride (SiCN), and silicon oxynitride (SiON). In some embodiments, the capping layer 600 may be spaced apart from the interlayer insulating layer 200 by the air gap 250. In other embodiments, the upper capping layer 600 may be in contact with a portion of the interlayer insulating layer 200.

FIGS. 2 to 7 are cross-sectional views illustrating a method of manufacturing a semiconductor device according to some example embodiments of the inventive concepts. Hereinafter, the descriptions described above will be omitted or mentioned briefly.

Figure 2:
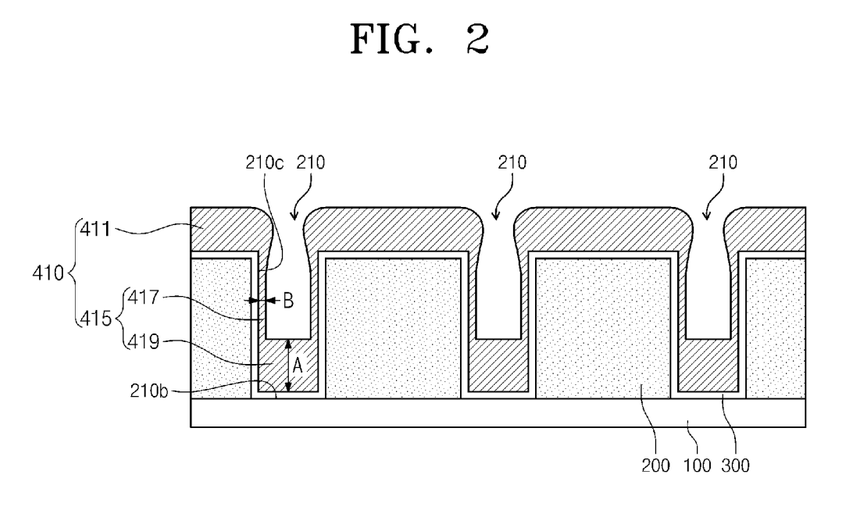
FIGS. 2 to 7 are cross-sectional views illustrating a method of manufacturing a semiconductor device according to some example embodiments of the inventive concepts.

Referring to FIG. 2, a barrier layer 300 and a metal layer 410 may be sequentially formed in openings 210. For example, a substrate 100 including an interlayer insulating layer 200 may be provided. The substrate 100 may be the same as described with reference to FIG. 1. The interlayer insulating layer 200 may have the openings 210. The openings 210 may penetrate the interlayer insulating layer 200. The openings 210 may expose the substrate 100. The interlayer insulating layer 200 may be formed of a dielectric layer including carbon. In some embodiments, the interlayer insulating layer 200 may include at least one of silicon carbonitride (SiCN), SiOCH, and porous-SiOCH. The barrier layer 300 may be formed in the openings 210 and on a top surface of the interlayer insulating layer 200. For example, the barrier layer 300 may cover sidewalls 210c and bottom surfaces 210b of the openings 210. The barrier layer 300 may be formed by depositing at least one of the materials described with reference to FIG. 1 on the substrate 100.

The metal layer 410 may be deposited on the substrate 100 to cover the barrier layer 300. The metal layer 410 may include an upper metal layer 411 disposed on the top surface of the interlayer insulating layer 200, and a lower metal layer 415 provided in each of the openings 210. The lower metal layer 415 may include a sidewall portion 417 provided on the sidewall 210c of the opening 210 and a bottom portion 419 provided on the bottom surface 210b of the opening 210. A thickness A of the bottom portion 419 may be greater than a thickness B of the sidewall portion 417. The upper metal layer 411 may be thicker than the sidewall portion 417 of the lower metal layer 415. The metal layer 410 may include copper.

Figure 3:
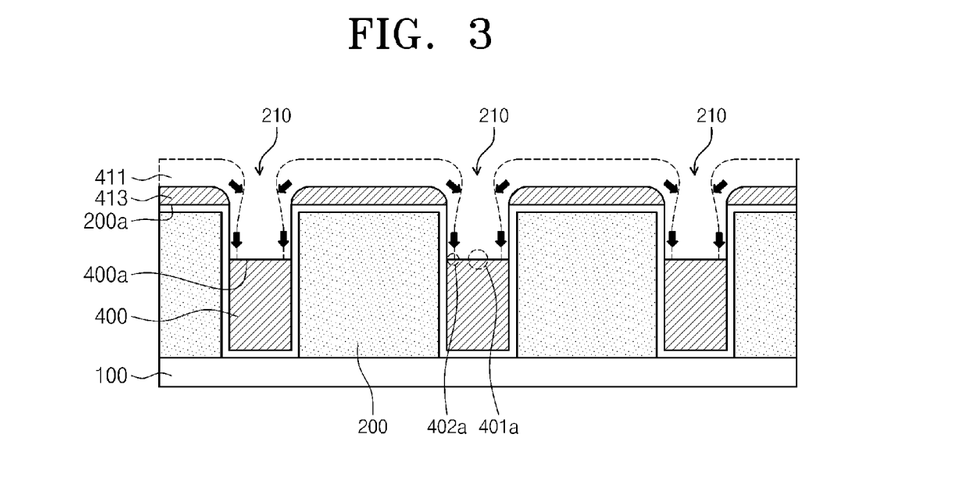

Referring to FIG. 3, the metal layer 410 of FIG. 2 may be reflowed to form metal patterns 400 in the openings 210, respectively. In some embodiments, the deposition process of the metal layer 410 and the reflow process of the metal layer 410 may be performed in-situ. The metal layer 410 may be thermally treated to perform the reflow process. There flow process may be performed at a temperature of about 200° C. to about 400° C. for a time of about 10 seconds to about 300 seconds. As illustrated by a dotted line of FIG. 3, the upper metal layer 411 may migrate into the openings 210 by the reflow process, so that the metal patterns 400 may be formed. After the reflow process, a portion of the upper metal layer 411 may remain on the top surface of the interlayer insulating layer 200 to form a residual metal layer 413. At this time, at least one of the process temperature and the process time of the reflow process may be controlled such that the metal patterns 400 may be separated from the residual metal layer 413 disposed on the top surface of the interlayer insulating layer 200. In other embodiments, the deposition process and the reflow process of the metal layer 410 may be repeatedly performed to form the metal patterns 400. Top surfaces 400a of the metal patterns 400 may be disposed at a level lower than the topmost surface 200a of the interlayer insulating layer 200. The metal patterns 400 according to the inventive concepts may not be exposed during an etching process. If the metal patterns 400 are formed by an etching process, top surfaces of the metal patterns 400 may become rough. The top surfaces 400a of the metal patterns 400 according to the inventive concepts may have a surface roughness value less than that of an etched surface of a metal. An edge portion 402a of the top surface 400a may be disposed at a substantial same level as a center portion 401a of the top surface 400a.

Figure 4:
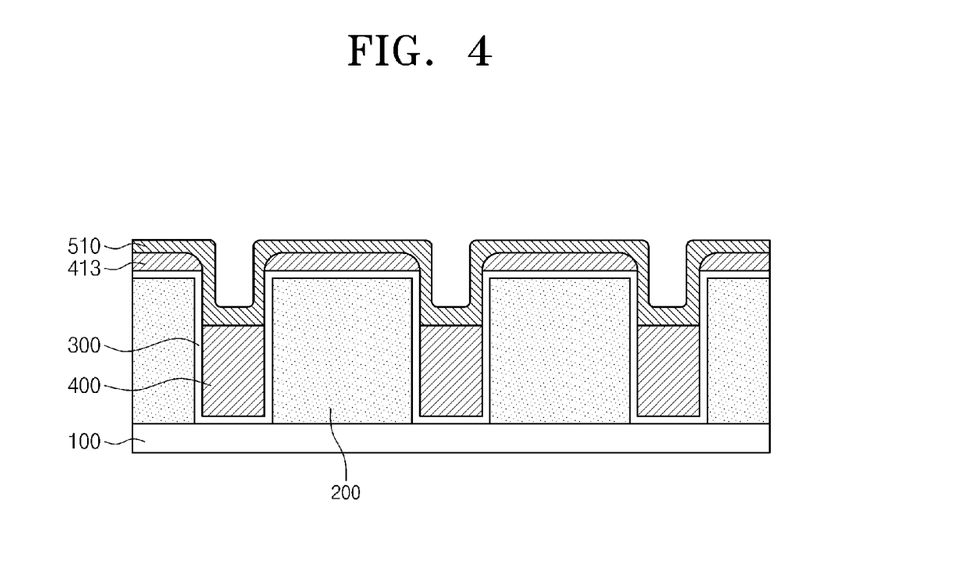

Referring to FIG. 4, a capping layer 510 may be formed on the substrate 100 to cover the metal patterns 400. The capping layer 510 may be provided on the metal patterns 400, sidewalls of the barrier layer 300, and the residual metal layer 413. The capping layer 510 may be formed by depositing a metallic material on the substrate 100. For example, the capping layer 510 may be deposited by a physical vapor deposition (PVD) process. The capping layer 510 may include at least one of cobalt, ruthenium, tantalum, tantalum nitride, titanium, and titanium nitride. The capping layer 510 may partially fill the openings 210. The topmost surface of the capping layer 510 may be disposed at a substantially same level as or a higher level than the topmost surface of the interlayer insulating layer 200.

Figure 5:
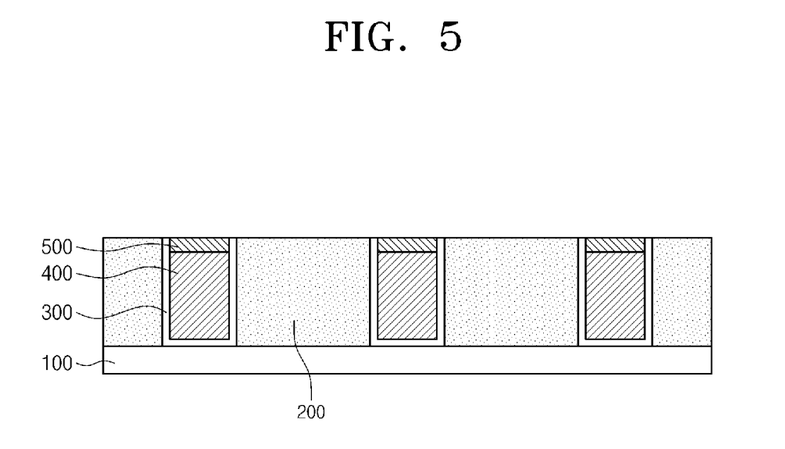

Referring to FIG. 5, the capping layer 510 and the interlayer insulating layer 200 may be planarized to form capping patterns 500 in the openings 210, respectively. In some embodiments, the planarization process may be performed by a chemical mechanical polishing (CMP) process. The capping patterns 500 are spaced apart from each other. A portion of the barrier layer 300 and the residual metal layer 413, which are disposed on the top surface of the interlayer insulating layer 200, may be removed by the planarization process such that the interlayer insulating layer 200 may be exposed. Thus, the barrier layers 300 respectively disposed in the openings 210 may be separated from each other. As a result, the metal patterns 400 may be electrically insulated from each other. Top surfaces of the capping patterns 500 may have a surface roughness value greater than that of the top surfaces of the metal patterns 400.

Figure 6:
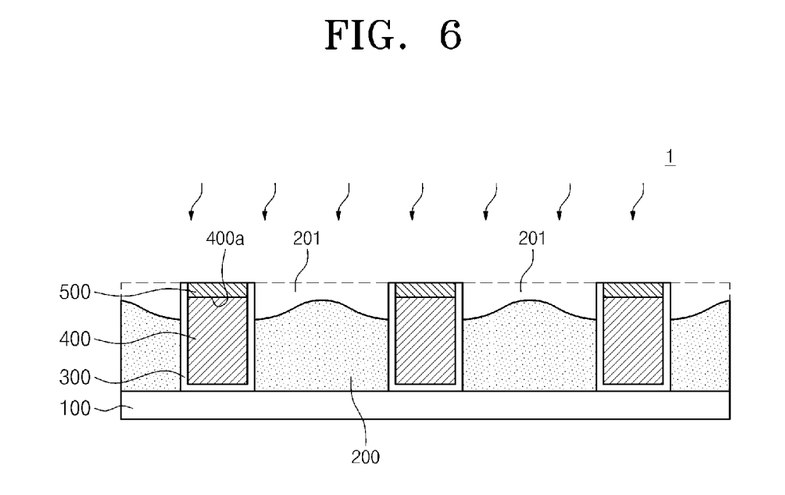

Referring to FIG. 6, at least a portion of the interlayer insulating layer 200 may be removed by a plasma treatment process and an etching process. For example, the plasma treatment process may be performed at a temperature of about 200° C. to about 400° C. under a pressure of about 3 Torr to about 8 Torr. A process gas of the plasma treatment process of the interlayer insulating layer 200 may include at least one of hydrogen ($H_2$), ammonia ($NH_3$), diazene ($N_2H_2$), nitrous oxide ($N_2O$), oxygen ($O_2$), carbon dioxide ($CO_2$), and carbon monoxide (CO). Carbon in an upper portion of the interlayer insulating layer 200 may be removed by the plasma treatment process such that a damaged interlayer insulating layer 201 may be formed. The damaged interlayer insulating layer 201 may be etched by a wet etching process using hydrofluoric acid (HF) or a dry etching process using a fluorocarbon ($C_xF_y$) gas. Since the damaged interlayer insulating layer 201 includes a silicon oxide ($Si_xO_y$) based material, the damaged interlayer insulating layer 201 may be easily removed. The interlayer insulating layer 200 which is not damaged may not be removed by the etching process. At this time, the capping patterns 500 may prevent the metal patterns 400 from being damaged during the plasma treatment process and the etching process.

Figure 7:
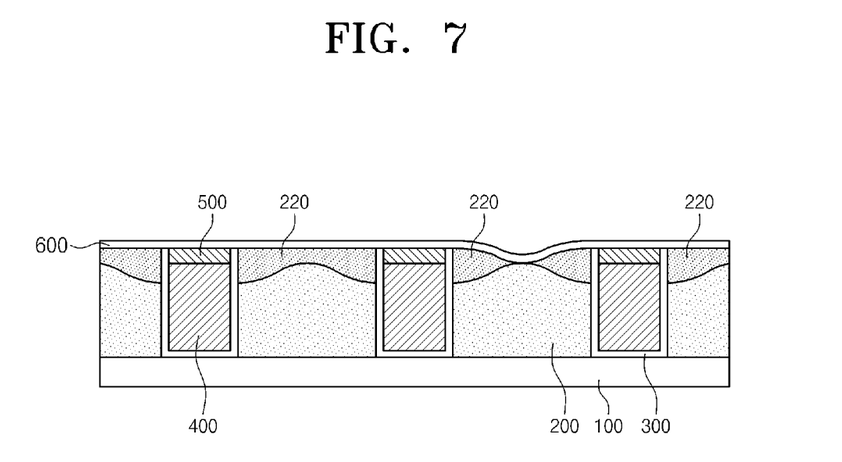

Referring to FIG. 7, the barrier layer 300, the metal pattern 400 and capping pattern 500 in each of the openings 210 may be defined as a conductive pattern. A sacrificial layer 220 may be formed on the interlayer insulating layer 200 between the conductive patterns. The sacrificial layer 220 may include hydrocarbon ($C_xH_y$). The topmost surface of the sacrificial layer 220 may be disposed at a substantially same level as the top surfaces of the capping patterns 500. An upper capping layer 600 may be disposed on the sacrificial layer 220 and the capping patterns 500. The upper capping layer 600 may include at least one of silicon dioxide ($SiO_2$), silicon nitride (SiN), SiOCH, silicon carbonitride (SiCN), and silicon oxynitride (SiON).

Referring again to FIG. 1, the sacrificial layer 220 may be removed to form an air gap 250 on the interlayer insulating layer 200. In some embodiments, the sacrificial layer 220 may be removed by an ashing process. The ashing process of the sacrificial layer 220 may be performed using a gas capable of generating hydrogen radicals or oxygen radicals at a temperature of about 200° C. to about 400° C. For example, the gas used in the ashing process may include at least one of ammonia ($NH_3$), hydrogen ($H_2$), nitrous oxide ($N_2O$), oxygen ($O_2$), carbon dioxide ($CO_2$), and carbon monoxide (CO). The hydrogen radicals or the oxygen radicals may pass through the upper capping layer 600 to react with the sacrificial layer 220. In some embodiments, the hydrocarbon included in the sacrificial layer 220 may react with the hydrogen radicals or the oxygen radicals to form a carbon-containing gas such as methane ($CH_4$), carbon dioxide ($CO_2$) or carbon monoxide (CO). The carbon-containing gas may pass through the upper capping layer 600 to be exhausted outside. Thus, the sacrificial layer 220 may be removed, so that the air gap 250 may be formed between the interlayer insulating layer 200 and the upper capping layer 600. The upper capping layer 600 may be spaced apart from the interlayer insulating layer 200 by the air gap 250. In other embodiments, a portion of the upper capping layer 600 may descend to become in contact with the interlayer insulating layer 200 when the sacrificial layer 220 is removed. At this time, the capping patterns 500 may prevent the metal patterns 400 from being damaged by plasma. The top surfaces 400a of the metal patterns 400 of the inventive concepts are not damaged by the plasma. Thus, the top surfaces 400a of the metal patterns 400 may be flat. As a result, the electrical characteristics and the reliability of the semiconductor device 1 may be improved by the capping patterns 500.

[Applications]

Figure 8:
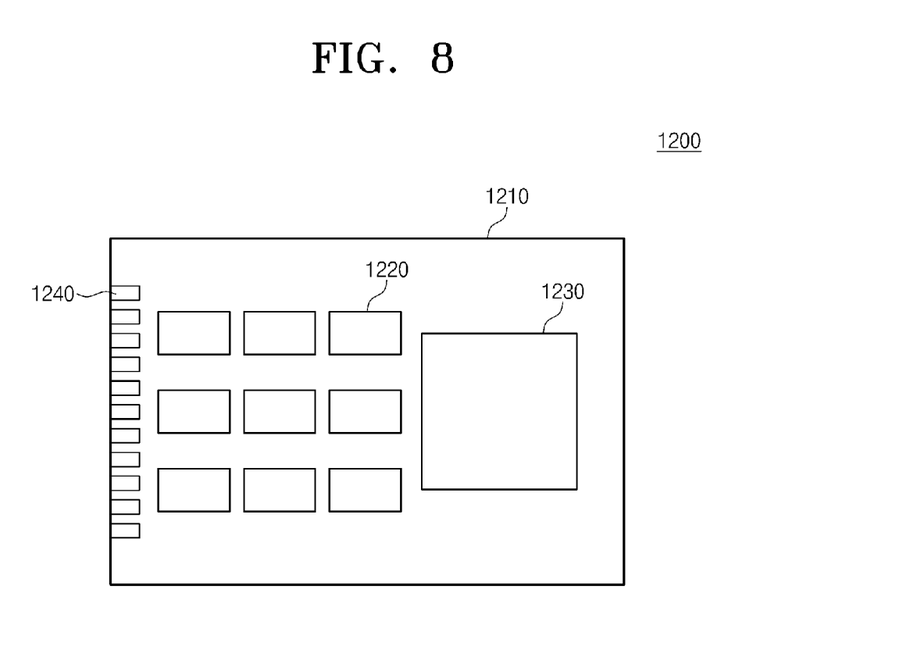
FIG. 8 is a schematic diagram illustrating an example of a package module including a semiconductor device according to some example embodiments of the inventive concepts.
Figure 9:
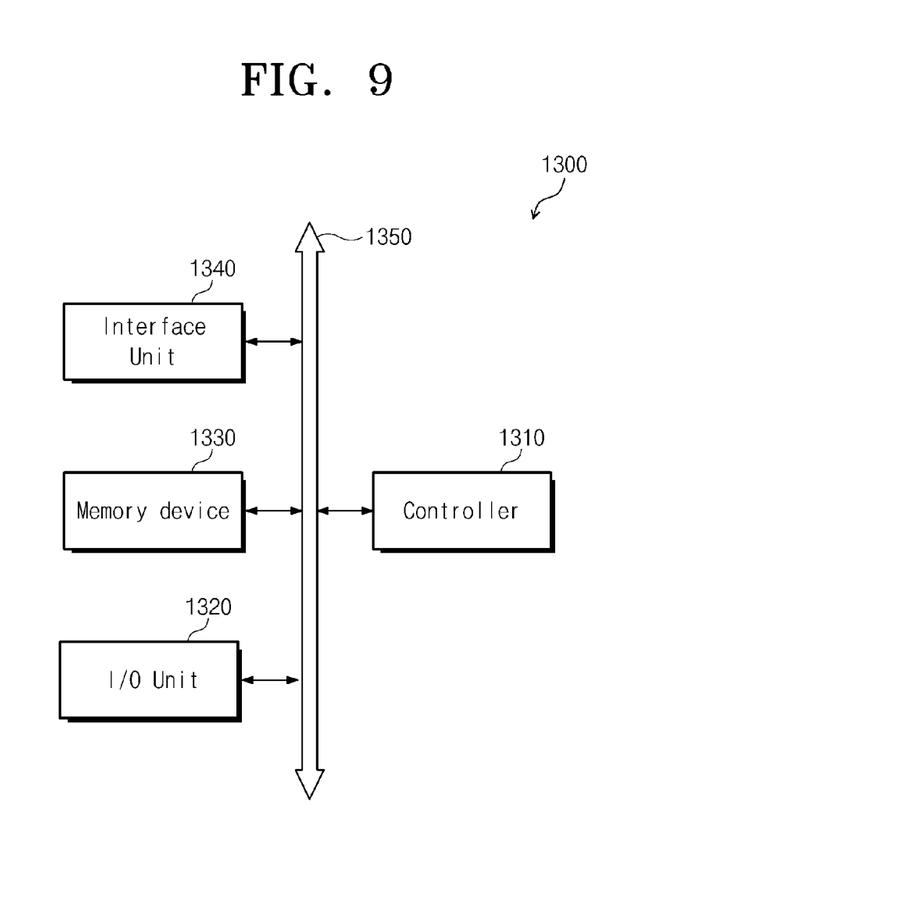
FIG. 9 is a schematic block diagram illustrating an example of an electronic system including a semiconductor device according to some example embodiments of the inventive concepts.
Figure 10:
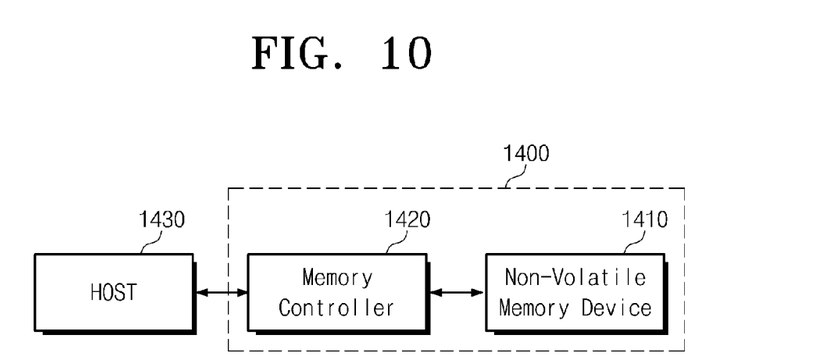
FIG. 10 is a schematic block diagram illustrating an example of a memory card including a semiconductor device according to some example embodiments of the inventive concepts.

FIG. 8 is a schematic diagram illustrating an example of a package module including a semiconductor device according to some example embodiments of the inventive concepts. FIG. 9 is a schematic block diagram illustrating an example of an electronic system including a semiconductor device according to some example embodiments of the inventive concepts. FIG. 10 is a schematic block diagram illustrating an example of a memory card including a semiconductor device according to some example embodiments of the inventive concepts.

Referring to FIG. 8, a package module 1200 may include a semiconductor integrated circuit chip 1220 and a semiconductor integrated circuit device 1230 packaged using a quad flat package (QFP) technique. The semiconductor integrated circuit chip 1220 and the semiconductor integrated circuit device 1230 may include the semiconductor device 1 according to embodiments of the inventive concepts. The package module 1200 may be connected to an external electronic device through external connection terminals 1240 provided on a side of a board 1210.

Referring to FIG. 9, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, and other logic devices having a similar function to any one thereof. The controller 1310 and the memory device 1330 may include the semiconductor device 1 according to the aforementioned embodiments of the inventive concept. The I/O unit 1320 may include at least one of a keypad, a keyboard and a display unit. The memory device 1330 is a device storing data. The memory device 1330 may store data and/or commands executed by the controller 1310. The memory device 1330 may include a volatile memory device and/or a non-volatile memory device. In some embodiments, the memory device 1330 may include a flash memory device. For example, the flash memory device applied with the technique according to the inventive concept may be installed in an information processing system such as a mobile device or a desk top computer. The flash memory device may be realized as solid state disks (SSD). In this case, the electronic system 1300 may stably store massive data in the memory device 1330. The electronic system 1300 may further include an interface unit 1340 that transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic system 1300 may be used in a communication interface protocol such as a third generation communication system (e.g., Code Division Multiple Access (CDMA), Global System for Mobiles (GSM), North American Digital Cellular (NADC), Extended Time Division Multiple Access (E-TDMA), Wideband Code Division Multiple Access (W-CDMA), CDMA2000).

Referring to FIG. 10, a memory card 1400 may include a non-volatile memory device 1410 and a memory controller 1420. The non-volatile memory device 1410 and the memory controller 1420 may store data or may read stored data. The non-volatile memory device 1410 may include the semiconductor device 1 according to the aforementioned embodiments of the inventive concept. The memory controller 1420 may read data from/store data into the non-volatile memory device 1410 in response to read/write request of a host 1430.

According to embodiments of the inventive concepts, the metal layer may be formed in the openings, and the metal layer may be then reflowed to form the metal patterns. Thus, the metal patterns have the top surfaces that are not etched. Additionally, the metal patterns do not include a void therein. The capping patterns cover the metal patterns. Thus, the metal patterns may be prevented from being damaged during the formation process of the air gap. As a result, the semiconductor device according to the inventive concepts may have the improved electrical characteristics and the improved reliability. Additionally, the semiconductor device of the inventive concepts includes the air gap between the metal patterns. Thus, the parasitic capacitance between the metal patterns may be reduced.

While the inventive concepts have been described with reference to some example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description It should be understood that example embodiments described herein should be considered in a descriptive sense only and not for purposes of limitation. Descriptions of features or aspects within example embodiments should typically be considered as available for other similar features or aspects in other example embodiments.

What is claimed is:

1. A method of manufacturing a semiconductor device, the method comprising:
    forming an interlayer insulating layer having openings on a substrate;
    forming a metal layer in the openings and on the interlayer insulating layer, the metal layer including a sidewall portion on a sidewall of each of the openings and a bottom portion on a bottom surface of each of the openings, wherein the bottom portion is thicker than the sidewall portion;
    reflowing the metal layer to form metal patterns in the openings, the metal patterns having top surfaces at a level lower than a topmost surface of the interlayer insulating layer;
    forming capping patterns covering the metal patterns in the openings; and
    forming an air gap on the interlayer insulating layer between the openings.

2. The method of claim 1, wherein the air gap is formed after the forming of the capping patterns.

3. The method of claim 1, wherein the metal patterns include copper.

4. The method of claim 1, wherein the metal layer includes an upper metal layer and a lower metal layer,
    wherein the upper metal layer is provided on the top surface of the interlayer insulating layer,
    wherein the lower metal layer is provided in each of the openings,
    wherein the reflowing of the metal layer includes migrating the upper metal layer into the openings to form the metal patterns, and
    wherein the metal patterns are separated from the upper metal layer remaining on the top surface of the interlayer insulating layer while the metal layer is reflowed.

5. The method of claim 1, further comprising:
    forming a barrier layer on the bottom surfaces and the sidewalls of the openings before the forming of the metal layer.

6. The method of claim 1, wherein the forming of the capping patterns comprises:
forming a capping layer covering the metal patterns and the interlayer insulating layer; and
planarizing the capping layer and the interlayer insulating layer;
wherein a portion of the metal layer remains on the interlayer insulating layer after the metal layer is reflowed, and
wherein the planarizing of the capping layer and the interlayer insulating layer includes removing the remaining portion of the metal layer.

7. The method of claim 6, wherein the capping layer is planarized by a chemical mechanical polishing (CMP) process, and
wherein the metal patterns are not exposed during the CMP process.

8. The method of claim 1, wherein the forming of the metal layer and the reflowing of the metal layer are performed in-situ.

9. The method of claim 1, wherein the capping patterns include one or more of cobalt, ruthenium, tantalum, tantalum nitride, titanium, and titanium nitride.

10. The method of claim 1, wherein the forming of the air gap comprises:
forming a sacrificial layer on the interlayer insulating layer between the openings;
forming an upper capping layer on the sacrificial layer; and
removing the sacrificial layer through the upper capping layer.

11. A method of manufacturing a semiconductor device, the method comprising:
forming an insulating layer, including openings, on a substrate;
forming a metal layer in the openings and on the insulating layer, the metal layer including portions on sidewalls and bottoms of the openings;
reflowing the metal layer to form metal patterns in the openings;
forming capping patterns covering the metal patterns in the openings; and
forming an air gap on the insulating layer between the openings.

12. The method of claim 11, wherein the portions on the sidewalls of the openings are thinner than the portions on the bottoms of the openings.

13. The method of claim 11, wherein the forming of the air gap comprises:
forming a sacrificial layer on the insulating layer between the openings;
forming an upper capping layer on the sacrificial layer; and
removing the sacrificial layer through the upper capping layer.

14. The method of claim 11, wherein the air gap is formed after the forming of the capping patterns.

15. The method of claim 11, further comprising:
forming a barrier layer on the bottom surfaces and the sidewalls of the openings before the forming of the metal layer.

16. A method of manufacturing a semiconductor device, the method comprising:
forming an insulating layer, including openings, on a substrate;
forming a metal layer in the openings and on the insulating layer, the metal layer including portions on sidewalls and bottoms of the openings;
reflowing the metal layer to form metal patterns in the openings;
forming capping patterns covering the metal patterns in the openings; and
forming an air gap, that contacts an upper surface of the insulating layer, between the openings.

17. The method of claim 16, wherein the forming of the air gap comprises:
forming a sacrificial layer, that contacts the upper surface of the insulating layer, between the openings;
forming an upper capping layer on the sacrificial layer; and
removing the sacrificial layer through the upper capping layer.

18. The method of claim 17, wherein the air gap extends from the upper surface of the insulating layer to a lower surface of the upper capping layer.

19. The method of claim 16, wherein the air gap is formed after the forming of the capping patterns.

20. The method of claim 16, further comprising:
forming a barrier layer on the bottom surfaces and the sidewalls of the openings before the forming of the metal layer.

* * * * *